US009997458B2

(12) United States Patent
Carbonell et al.

(10) Patent No.: US 9,997,458 B2
(45) Date of Patent: Jun. 12, 2018

(54) METHOD FOR MANUFACTURING GERMAMDE INTERCONNECT STRUCTURES AND CORRESPONDING INTERCONNECT STRUCTURES

(71) Applicant: IMEC VZW, Leuven (BE)

(72) Inventors: Laure Elisa Carbonell, Leuven (BE); Antony Premkumar Peter, Leuven (BE); Marc Schaekers, Leuven (BE); Sven Van Elshocht, Leuven (BE); Zsolt Tokei, Leuven (BE)

(73) Assignee: IMEC vzw, Leuven (BE)

( * ) Notice: Subject to any disclaimer, the term of this patent is extended or adjusted under 35 U.S.C. 154(b) by 0 days. days.

(21) Appl. No.: 14/400,769

(22) PCT Filed: May 14, 2013

(86) PCT No.: PCT/EP2013/059971
§ 371 (c)(1),
(2) Date: Nov. 12, 2014

(87) PCT Pub. No.: WO2013/171235
PCT Pub. Date: Nov. 21, 2013

(65) Prior Publication Data
US 2015/0130062 A1 May 14, 2015

Related U.S. Application Data

(60) Provisional application No. 61/646,439, filed on May 14, 2012.

(51) Int. Cl.
*H01L 23/532* (2006.01)
*H01L 21/768* (2006.01)
(Continued)

(52) U.S. Cl.
CPC .. *H01L 23/53209* (2013.01); *H01L 21/28518* (2013.01); *H01L 21/3212* (2013.01);
(Continued)

(58) Field of Classification Search
CPC ......... H01L 23/53233; H01L 23/53209; H01L 21/76879; H01L 21/76802; H01L 21/76886; H01L 2224/05157
See application file for complete search history.

(56) References Cited

U.S. PATENT DOCUMENTS 4,171,235 A * 10/1979 Fraas ................. H01L 31/0687
117/101
5,420,069 A * 5/1995 Joshi ................. H01L 21/76838
257/E21.582

(Continued)

OTHER PUBLICATIONS

PCT/EP2013/059971 written opinion.*
(Continued)

*Primary Examiner* — Tom Thomas
*Assistant Examiner* — Vincent Wall
(74) *Attorney, Agent, or Firm* — McDonnell Boehnen Hulbert & Berghoff LLP

(57) ABSTRACT

Method for forming an interconnect structure, comprising the steps of: forming a recessed structure in a dielectric material on a substrate; at least partially filling said recessed structure with a metal chosen from the group consisting of copper, nickel and cobalt; introducing the substrate in a CVD reactor; bringing the substrate in the CVD reactor to a soak temperature and subsequently performing a soak treatment by supplying a germanium precursor gas to the CVD reactor at the soak temperature, thereby substantially completely converting the metal in the recessed structure to a germanide.

22 Claims, 17 Drawing Sheets

(51) Int. Cl.
*H01L 21/321* (2006.01)
*H01L 23/528* (2006.01)
*H01L 21/285* (2006.01)

(52) U.S. Cl.
CPC .. *H01L 21/76802* (2013.01); *H01L 21/76843* (2013.01); *H01L 21/76856* (2013.01); *H01L 21/76879* (2013.01); *H01L 21/76883* (2013.01); *H01L 21/76886* (2013.01); *H01L 21/76889* (2013.01); *H01L 23/528* (2013.01); *H01L 23/53233* (2013.01); *H01L 23/53238* (2013.01); *H01L 23/53261* (2013.01); *H01L 2924/0002* (2013.01)

(56) References Cited

U.S. PATENT DOCUMENTS

| | | | | |
|---|---|---|---|---|
| 5,670,425 | A * | 9/1997 | Schinella | H01L 21/76879 257/E21.586 |
| 5,801,444 | A | 9/1998 | Aboelfotoh et al. | |
| 5,856,026 | A | 1/1999 | Joshi et al. | |
| 5,925,232 | A * | 7/1999 | Ayers | C25B 1/00 117/99 |
| 6,046,108 | A * | 4/2000 | Liu | H01L 21/7684 257/E21.583 |
| 6,143,657 | A * | 11/2000 | Liu | H01L 21/76805 257/751 |
| 6,255,217 | B1 * | 7/2001 | Agnello | H01L 21/3185 257/E21.054 |
| 6,797,652 | B1 * | 9/2004 | Ngo | H01L 21/76826 257/E21.576 |
| 7,396,759 | B1 * | 7/2008 | van Schravendijk | H01L 21/76834 257/E21.575 |
| 2007/0080461 | A1 * | 4/2007 | Lu | H01L 21/76807 257/758 |
| 2007/0275548 | A1 * | 11/2007 | Lavoie | H01L 21/76877 438/597 |
| 2009/0218640 | A1 | 9/2009 | Hampp | |

OTHER PUBLICATIONS

Mahadik et al., "Thermally stable Ge/Cu/Ti Ohmic Contacts to n-type GaN", Journal. of Elec. Mat., vol. 35, No. 11, 2006, pp. 2035-2040.*

Lee et al., Effect of Under-Layer Treatment of Ta/TaN Barrier Film on Corrosion Between Cu Seed and Ta in Chemical-Mechanical-Polishing Slurry, Journal of NanoScience and Nanotechnology, col. 10, 2010, pp. 4196-4203.*

Tavakkoli et al., "Path to achieve sub-10nm half-pitch using electron beam lithography", Journal of Vac. Sci. and Tech., 29, 2011, pp. 011035-1 to-7.*

Yan et al., "Spontaneous Growth and Phase Transformation of Highly Conductive Nickel Germanide Nanowires", ASCNano, vol. 5, No. 6, 2011, pp. 5006-5014.*

PCT International Search Report, PCT Application No. PCT/EP2013/059971, dated Aug. 1, 2013.

Dhar, S. et al., "Room-Temperature Synthesis of Cooper Germanide Phase by Ion Beam Mixing", Appl. Phys. Lett., vol. 67, No. 12, Sep. 18, 1995, pp. 1700-1702.

R.V. Joshi et al., "Low Temperature, Low Resistivity Sub-Half Micron Via/Interconnect Structure Using Reaction of Al-Alloys and Germane," IEEE Electron Devices Meeting, 1995. IEDM '95., 257-260 (1995).

* cited by examiner

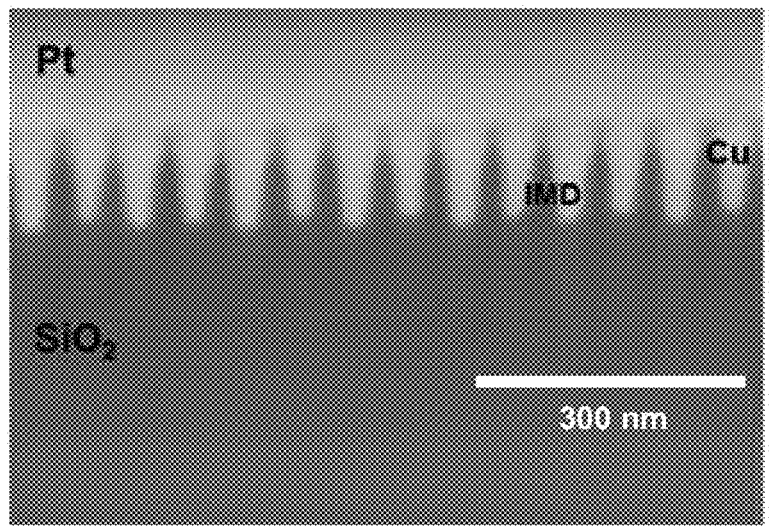
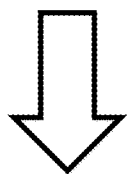
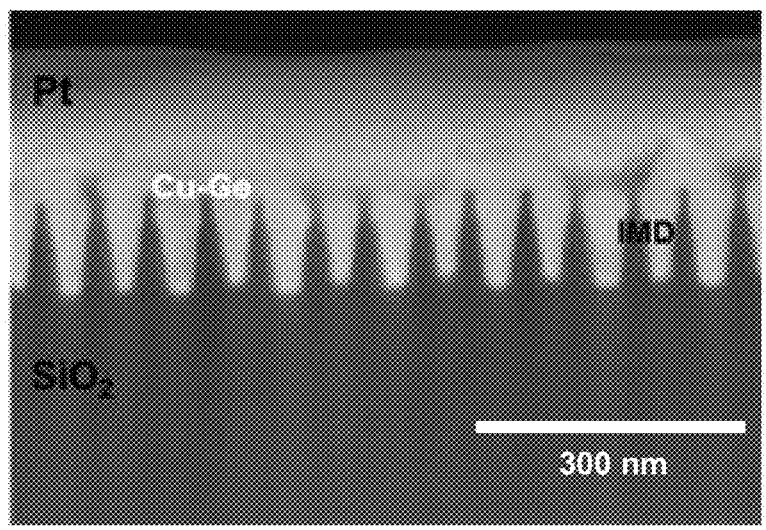
FIGURE 2 forming a recessed structure in a dielectric material on a substrate, the recessed structure having a bottom

↓ at least partially filling, from the bottom up, said recessed structure with a metal, the metal being chosen from the group consisting of copper, nickel and cobalt, or combinations thereof

↓ introducing the substrate in a CVD reactor

↓ bringing the substrate in the CVD reactor to a soak temperature and subsequently performing a soak treatment by supplying a germanium precursor gas to the CVD reactor at the soak temperature, wherein the soak treatment is performed to convert substantially all of the chosen metal any copper metal, nickel metal and cobalt metal present in the recessed structure to a germanide such that the recessed structure is completely filled, and substantially no copper metal, nickel metal, or cobalt metal remains in the recessed structure

FIGURE 11 d/2 ≤ 30 nm d/2 ≤ 10 nm

METHOD FOR MANUFACTURING GERMAMDE INTERCONNECT STRUCTURES AND CORRESPONDING INTERCONNECT STRUCTURES

TECHNICAL FIELD

This disclosure relates to a method for manufacturing germanide interconnect structures and to the interconnect structures achievable by said method.

BACKGROUND OF THE DISCLOSURE

With the reduction of geometry sizes and the increase of aspect ratios, the ability to achieve a uniform Cu metallization becomes increasingly difficult. With the down scaling of the interconnect technology, in sub-30 nm line width regions, the resistivity of traditional copper (Cu) interconnects is expected to dramatically increase. This resistivity increase is mainly associated with the increased grain boundary and surface scattering of copper (Cu). Therefore, a copper (Cu) replacements needs to be found for the next generation of interconnects.

Metal is a promising alternative as a potential replacement for Cu as interconnect metal due to the slow resistivity increase in dimensions below 30 nm. However, the suitability of metal is mainly determined by its filling ability and the impact of finite size effects on its electrical and reliability properties that should be on the same order as narrow copper lines.

However, current methods for obtaining a low resistive metal phase are not suitable to be integrated in the fabrication of narrow line interconnect structures in semiconductor devices.

SUMMARY OF THE DISCLOSURE

It is an aim of the present disclosure to provide a method for forming interconnect structures suitable for application on sub-30 nm, while keeping a low resistivity.

This aim is achieved according to the disclosure with a method comprising the steps of the first independent claim.

In particular it has been found that metal germanides offer a good replacement for copper (Cu) due to their slower resistivity increase as compared to copper (Cu) in dimensions below 30 nm. Suitable metal germanides may be chosen from the group of copper (Cu), nickel (Ni) and cobalt (Co), or combinations thereof. However, known methods for obtaining the desired phase of the metal germanides in dimensions below 30 nm are not suitable to be integrated in the interconnect fabrication of semiconductor devices. This can be overcome by the method of the present disclosure, which allows a solid vapour reaction between the metal and the germanide, referred to as germanidation, to take place even in narrow pitch structures characterised by a half pitch of 30 nm or smaller.

In an embodiment of the present disclosure the chosen metal may be copper (Cu). In order to achieve germanidiation of copper (Cu) the substrate is brought to a pre-clean temperature which is preferably equal to the soak temperature, followed by plasma assisted pre-clean performed in-situ at a reducing atmosphere. The resulting germanide is a copper germanide ($Cu_3Ge$) alloy having a $\varepsilon 1$-$Cu_3Ge$ phase. By applying the plasma assisted clean in-situ the native copper oxide (CuO) present on the copper film is removed before the exposure to germanium precursor thereby facilitating the solid vapor reaction between copper and the germane gas. Comparative studies have shown that ex-situ plasma assisted clean does not lead to the germanidation of copper having a $\varepsilon 1$-$Cu_3Ge$ phase.

The in-situ plasma assisted clean is performed in a reducing atmosphere environment to minimize the damage caused to the dielectric material during this step. Such reducing environment may include but not limited to $He/H_2$ and $NH_3/N_2$, wherein the former has the advantage of being more compatible with low-k dielectric materials.

It has been found that the selectivity of the germanidation reaction can be affected by the plasma temperature. In a particular embodiment, the plasma assisted pre-clean may be performed at a temperature of 250° C. to avoid that the germanidation reactions affects other metals deposited in the recessed structure or the dielectric materials.

In an embodiment, the copper germanide ($CuGe_3$) alloy is formed on a TaN/Ta stack, which is deposited on the dielectric material, e.g., silicon oxide ($SiO_2$), prior to the copper (Cu) deposition. The deposition of TaN/Ta results in a copper germanide ($CuGe_3$) alloy having low sheet resistance and good adhesion properties. Furthermore, the TaN/Ta stack prevents copper (Cu) from diffusing into the dielectric material.

In another embodiment, the metal chosen as a replacement for copper (Cu) in interconnect structures may be nickel (Ni). By using nickel (Ni) a low sheet resistance nickel germanide (NiGe) layer can be produced directly on top of the dielectric layer without the need of traditional barrier layers, since nickel (Ni) does not react with silicon oxide or other dielectric materials. As a result the resistivity value of the nickel germanide (NiGe) layer is not affected by contribution from the underlying layers, as is the case with copper germanide ($CuGe_3$) and copper (Cu) on silicon (Si).

Moreover, nickel germanide (NiGe) is corrosion resistant and therefore the plasma assisted clean step to remove the native oxide, as performed for $Cu_3Ge$ can be avoided. This can be beneficial in reducing damage to the dielectric material, e.g in low-k dielectric material.

In yet another embodiment, cobalt (Co) may be used as a replacement for Copper (Cu). To achieve the cobalt germanide ($CoGe_2$) alloy, the cobalt (Co) may be grown in a titanium nitride (TiN) layer of e.g. around 2 nm, applied in preceding steps.

According to embodiments of the present disclosure, the germanium precursor may be germane, e.g. $GeH_4$, supplied in the presence of a carrier gas to induce a catalyzed chemical vapor reaction, wherein preferably the carrier gas is $N_2$. The flow rate of the germane precursor ($GeH_4$) can be adjusted to the desired partial pressure in the PECVD chamber where the germanidation takes place. This partial pressure of the germanium precursor in the reactor may be for example between 70 to 420 mTorr.

Furthermore it has been found that the soak time, the partial pressure of Ge precursor ($GeH_4$,) and the soak temperature (also referred to as germanidation temperature) are interrelated variables which have to be chosen according to the thickness of the chosen metal films. In an embodiment, the soak temperature for any of the copper (Cu), nickel (Ni) and cobalt (Co) films is maintained in the range between 250° C. to 400° C.

According to any of the embodiments of the present disclosure, the recessed structure is part of a repetitive pattern having a half pitch equal to or smaller than 30 nm, more preferably equal to or smaller than 10 nm. This repetitive pattern is part of an interconnect structure, wherein the recessed structure is a via or a trench.

According to embodiments of the present disclosure the dielectric material is an inter-metal dielectric (IMD), i.e. the dielectric material is suitable to be used as intermetal dielectric (IMD). Non limitative examples of IMD are: low-k materials, oxides, dielectric including pores and/or airgaps. The dielectric material preferably comprises a low-k material. The low-k materials are dielectrics characterized by a dielectric constant lower than that of silicon oxide which are widely used in interconnect applications.

According to embodiments of the present invention, a Chemical Mechanical Polishing (CMP) step may be employed to remove the overgrowth on top of the trenches caused by the volume increase of the resulting metal germanide alloy.

Alternatively, the recessed structure may be partially filled with the metal films, such as copper (Cu), nickel (Ni) and cobalt (Co), thereby accounting for any volume expansion occurring after the conversion of the metal to the $Cu_3Ge$ alloy. In this way a substantially flush top surface can be achieved without the need for employing CMP to remove any overgrowth, thereby reducing or preventing the damage to the dielectric. This is especially advantageous in the case where the dielectric comprises a low-k material It is a second aim of the present disclosure to provide an interconnect structure formed in a dielectric material, characterized in that the interconnect structure is made substantially of a germanide of a metal.

This second aim is achieved according to the disclosure with the interconnect structure showing the technical characteristics of the second independent claim.

The interconnect structure according to the present disclosure may be further extended into an array of interconnect structures to form a repetitive pattern with a half pitch equal to or smaller than 30 nm.

Furthermore, the array of interconnect structures can be integrated in a semiconductor device and be adapted to cooperate with active and passive components found therein.

BRIEF DESCRIPTION OF THE DRAWINGS

All drawings are intended to illustrate some aspects and embodiments of the present disclosure. The drawings described are only schematic and are non-limiting.

FIG. 2 shows the cross-section Scanning Electron Microscopy (SEM) image of a 30/30 nm meander fork structure after CMP (left picture) and after Cu germanidation (right picture).

FIG. 11 is a process flow chart for a method of making a copper germanide interconnect structure according to one embodiment of the disclosure.

DETAILED DESCRIPTION OF ILLUSTRATIVE EMBODIMENTS

Figure 1:
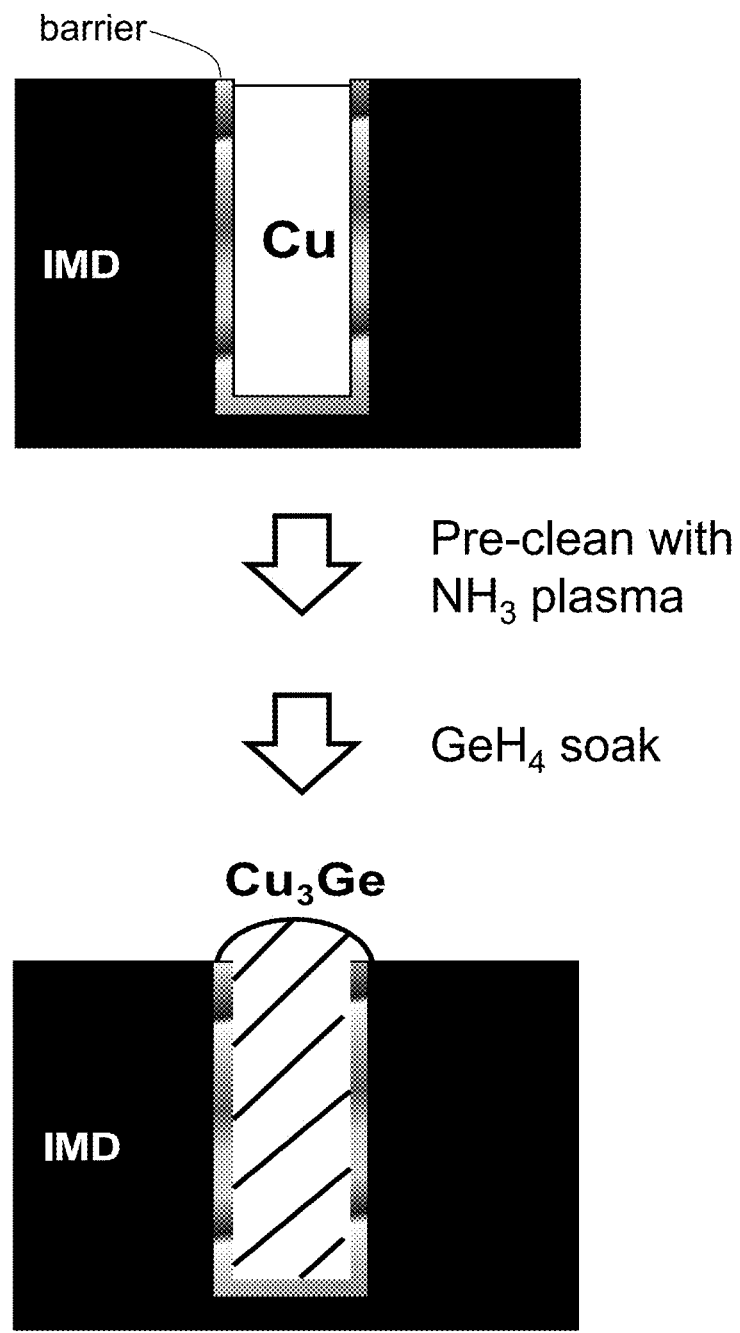
FIG. 1 represents schematically the germanidation of Cu trenches after full metal Chemical Mechanical Polishing (CMP). First trenches are formed in the inter-metal dielectric (IMD, e.g. a low-k dielectric material) and the trenches are filled with copper and subjected to CMP (left picture). After Cu CMP the filled trenches are subjected to an plasma assisted pre-clean in reducing ($NH_3$) atmosphere followed by a soak in $GeH_4$ at 250° C. leading to the formation of $Cu_3Ge$ in the trench by vapor-solid reaction (right picture).

According to a first embodiment, the present disclosure relates to a method for forming a copper germanide alloy in interconnect structures. In specific embodiments the first embodiment relates to a method for forming a copper germanide alloy in narrow interconnect structures characterized by a half pitch of 30 nm or smaller.

Further the present disclosure also relates to the interconnect structure (line, via) obtained with the method of the disclosure, which is made of homogeneous copper germanide having a $\varepsilon 1$-$Cu_3Ge$ phase.

With the down scaling of the interconnects technology, in the sub-20 nm line width regions, the resistivity of the interconnects increases with the dimensional scaling attributed to increased grain boundary and surface scattering, due to low electron mean free path of Cu (39 nm).

To address this challenge it was found that copper germanide ($Cu_3Ge$) is a good replacement for copper. A known drawback of copper films is that they exhibit dramatic increase of resistivity below 40-50 nm. Although copper germanide exhibits higher bulk resistivity compared to Cu, it has a slower resistivity increase for dimensions below 30 nm.

Copper germanides in general are known as adhesion improvement layer for silicon nitride and silicon oxide, corrosion resistant and surface passivation layer for CuO.

As Cu resistivity measured in 20 nm interconnects approaches 6 µOhm·cm, a ε1-Cu$_3$Ge metallization can become an interesting alternative for the interconnect metal as its intrinsic resistivity can be as low as 5.5 µOhm·cm for a range of Ge concentrations extending from 15 to 35 at. %. Moreover Cu$_3$Ge has a good oxidation resistance.

It is known that the low resistivity ε1-Cu$_3$Ge phase can be obtained by a solid state reaction process or ion beam mixing. However these methods are not suitable to be integrated in the interconnect fabrication of semiconductor devices.

In specific embodiments the present disclosure reveals a method for producing low resistivity ε1-Cu$_3$Ge in contacts and interconnects by using a solid vapor reaction between copper and GeH$_4$. This solid vapor reaction is also referred to herein below as germanidation. With the method of the disclosure the germanidation reaction takes place even in narrow pitch structures characterized by a half pitch of 30 nm or smaller.

In specific embodiments the germanidation of 30 nm half pitch Cu trenches with the formation of the low resistivity ε1-Cu$_3$Ge phase is disclosed. The method of the disclosure has a good phase control of the Cu$_3$Ge both in narrow and wide trenches and even on bond pad structures.

In different embodiments a method for forming an interconnect is disclosed comprising:

Forming a recessed structure in a dielectric material on a substrate

Filling said recessed structure with copper

Introducing the copper filled recessed structure in a CVD reactor and bringing the substrate at a pre-clean temperature of at least 250° C.

Performing a plasma assisted pre-clean in a reducing atmosphere in-situ and thereafter Performing a soak treatment with a germanium precursor at a soak temperature which is preferably equal with the pre-clean temperature thereby forming a homogenous copper germanide ε1-Cu$_3$Ge phase in the whole recessed structure.

Filling said recessed structure with copper (also referred to as copper metallization) is performed by physical vapor deposition (PVD). Alternatively, the copper metallization can be performed by ECP (standard Cu electroplating onto a PVD Cu seed), by Direct Plating (Cu electroplating directly onto a barrier), by CVD Cu and by ELD Cu (electroless Cu deposition).

In different embodiments of the disclosure the dielectric material is an inter-metal dielectric (IMD). Non limiting examples of IMD are: low-k materials, oxides, dielectric including pores and/or airgaps. The low-k materials are dielectrics characterized by a dielectric constant lower than that of silicon oxide which are widely used in interconnect applications.

Underlying the copper filling conventional barrier and oxide stack are used SiO$_2$/TaN/Ta with Ta immediately underlying copper. Alternatively other barrier can be used with the method of the disclosure such as Atomic Layer Deposition (ALD) TaN, ALD TiN, Plasma Enhanced ALD (PEALD) RuTiN, (PE)ALD Ru, CVD Mn, CVD Co or any other suitable barrier materials.

The plasma assisted clean was performed in a reducing environment. Preferably the plasma clean is selected such that is compatible with low-k materials. Non-limiting examples of reducing environment are He/H$_2$ and NH$_3$/N$_2$. The former has the advantage of being more compatible with low-k materials.

In a specific embodiment the reducing environment is a mixture of NH$_3$ and N$_2$. In a particular example a flow of 160 sccm NH$_3$ and 18000 sccm of N$_2$ was employed at an RF power of 300 W.

The in-situ plasma assisted clean applied before the exposure to germanium precursor removes the native copper oxide (CuO) present on the copper film thereby facilitating the solid vapor reaction between copper and the germane gas.

Comparative tests shown that e.g. wet cleans applied ex-situ are not as efficient, e.g., applying an ex-situ clean with isopropyl-alcohol (IPA) immediately before GeH$_4$ soak treatment in comparable conditions does not lead to the reaction and the complete conversion of copper to copper germanide ε1-Cu$_3$Ge phase.

In different embodiments of the disclosure it was found that the germanidation reaction is selective to copper since no reaction has occurred with TaN/Ta and SiO$_2$ at 250° C.

It was observed that Cu$_3$Ge formation is possible both when copper is directly present on SiO$_2$ and when copper is deposited over TaN/Ta stack. However it was more discontinuous and rough on SiO$_2$ than on TaN/Ta stack. The sheet resistance (resistivity) of Cu$_3$Ge films was found to be higher on SiO$_2$ compared to the TaN/Ta stack. This is mainly due to the fact that Cu$_3$Ge layer is slightly more discontinuous because of a poorer adhesion of Cu on SiO$_2$.

The total pressure on the PECVD chamber where the Cu$_3$Ge formation takes place was in the range from 2 to 9 Torr. In specific embodiments the total pressure was 4.2 Torr. The flow rate of GeH$_4$ can be adjusted to the desired partial pressure, i.e. between 70 and 420 mTorr.

The flow of the germane gas (GeH$_4$) can be varied in between 250 to 4750 sccm. Either the chamber total pressure or the N$_2$ flow can be adjusted such that the required partial pressure is reached. From tests performed on blanket (not patterned) substrates but which are representative for the thicknesses used in interconnect structures, the GeH$_4$ partial pressure should be in the range of 70-420 mTorr depending on the Cu thickness such that a uniform ε1-Cu$_3$Ge phase is formed throughout the whole volume of the copper layer. In specific embodiments the flow of the germane gas (GeH$_4$) was about 3400 sccm for a total pressure in the reactor of 4.2 Torr.

The process of the first embodiments thus differs from conventional germanidation techniques wherein sequential Ge over Cu (or vice-versa) and Cu—Ge alloy deposition takes place first, followed by anneal to react the copper with germanium and form copper germanide. Advantageously the method is more suitable to form a uniform ε1-Cu$_3$Ge phase is formed throughout the whole volume of the copper layer/structure as it has a better control on the phase formation.

In specific embodiments the preparation of the 30 nm half pitch structures is described.

Single damascene 30 nm half pitch trenches were formed in a SiCOH low k material (having a k value of 3.1) by double patterning using a 30 nm TiN metal hard mask and thereafter metallized with copper. This patterning approach consists of a first litho-exposure step (M1A) followed by a hard mask dry-etch process and resist removal (ashing). Then, a second exposure with a different reticule (M1B) is followed by another hard mask dry-etch and ashing followed consequently by the dielectric dry-etch. For the Cu metallization, a 1.5 nm PVD TaN/Ta barrier layer was deposited prior to a 20 nm PVD Cu seed layer to provide electrical contact for Cu fill. The Cu filling of the features was done by electroplating followed by a post-plating anneal to optimize the Cu microstructure. The excess of barrier and Cu on the field areas was removed by chemical mechanical polishing (CMP). Due to compatibility issues between the Cu microstructure and the selective slurries used for the baseline CMP, high electrical yields could only be achieved when keeping the electroplating process, the post-plating anneal and the CMP steps are closely coupled in time. After metallization the 30 nm half pitch trenches have a Cu height of 90 nm.

Further the Cu germanidation in 30 nm half pitch structures is disclosed in detail.

The Cu germanidation process is schematically depicted in FIG. 1 for a sample as described above (TaN/Ta barrier layer in trench, filled with copper). In this embodiment, the Cu germanidation process comprises a 20 second pre-clean of the Cu surface using a $NH_3$ plasma followed by soaking the Cu trenches in $GeH_4$ while the wafer is heated at 250° C. Tests on blanket (unpatterned) wafers shown that the pre-clean duration might be further decreased to about 6 seconds at 250° C. without affecting the results. The germanidation was performed in a chemical vapor deposition (CVD) tool. The $GeH_4$ precursor was provided as gas flow over the Cu films to induce a catalyzed chemical vapor reaction and the carrier gas was $N_2$. The $GeH_4$ gas was diluted in $H_2$ to 10% and the reaction was performed at a chamber pressure (total pressure in the chamber) of 4.2 Torr. In the specific embodiment the actual flow rates were 3400 sccm $GeH_4$ and 6000 sccm $N_2$.

The soak time, the partial pressure of Ge precursor ($GeH_4$,) and the soak temperature (also referred to as germanidation temperature) are interrelated variables which have to be chosen according to the thickness of the Cu films. Alternatively the Ge precursor can be any of $GeCl_4$, digermane ($Ge_2H_6$), trigermane ($Ge_3H_8$), phenyl germane, $GeCl_3$, tetramethyl germane, tetraethyl germane, tetra n-butyl germane, germanium (IV) ethoxide, iso-butyl germane, trimethyl germanium chloride, iso-butyl germanium tri chlorides or combinations thereof.

Both the pre-clean temperature and the soak temperature are selected in the range from 250° C. to about 400° C.

In a particular example wherein the Cu film had a thickness of 10 nm and at a fixed $GeH_4$ partial pressure of 150 mTorr, a soak time of 30 s was sufficient at 250° C. to transform substantially the entire copper film into $Cu_3Ge$. Under the same conditions, a 60 nm of Cu requires 300 sec to convert Cu substantially completely into $Cu_3Ge$. But at 400° C., 60 nm Cu will require less soak time to transform to $Cu_3Ge$. The soak temperature is the temperature of the chuck which holds the substrate during germanidation and is measured with a thermocouple.

The optimal Cu germanidation conditions for the formation of the ε1 phase have been determined by using unpatterned PVD Cu layers. In particular, it has been found that the Cu surface pre-clean, substrate temperature and $GeH_4$ partial pressure are determining the formation of the desired $Cu_3Ge$ phase.

The $NH_3$ plasma pre-clean step is optimized to remove native $CuO_x$ present on the surface of the copper and to enable the Cu—$GeH_4$ reaction in the following step. The estimated time for full reaction conversion of an unpatterned PVD Cu layer to ε1-$Cu_3Ge$ is linear with the thickness of the layer and corresponds to a $GeH_4$ soak time of 470 seconds for a 90 nm thick PVD Cu layer.

Based on the curve determined for unpatterned Cu-layers we chose to soak the 30 nm half pitch trenches in $GeH_4$ for 470 seconds and 524 seconds, corresponding to the times required to fully convert respectively, 90 nm and 100 nm PVD Cu layers to ε1-$Cu_3Ge$. After the germanidation step, the wafers were passivated by deposition of SiCN layer having a thickness of 8 nm.

The formation of Cu—Ge alloy inside the trenches is accompanied by a volume increase that is characterized by Cu—Ge overgrowth on top of the trenches as evidenced by cross-section SEM inspections presented in FIG. 2. Interestingly no voids appear in the trenches after the Cu—Ge formation, irrespective of the $GeH_4$ soak time used in the previous examples. However increasing further the soak time might have a detrimental effect since the excess soak time will result initially in the incorporation of Ge in amorphous form and finally into mixed phase $Cu_3Ge+Ge$. This might lead to an increase of $R_S$ for the excess soak time.

The identification of the Cu—Ge alloy and phase formed inside the trenches was performed by indexing the selected area electron diffraction patterns of Cu—Ge grains from different trenches soaked in $GeH_4$ for 470 seconds. All selected area electron diffraction patterns could be indexed using the lattice parameters of the chemically ordered orthorhombic crystalline structure of ε1-$Cu_3Ge$. The copper germanide formed in the trench is homogenous and consist of orthorhombic crystalline ε1-$Cu_3Ge$ which is the phase showing low resistivity and therefore suitable to replace Cu.

Further chemical analysis of the copper germanide formed in the 30 nm half pitch trenches was performed by High-Angle Annular Dark-Field Scanning-Transmission Electron Microscopy (HAADF-STEM). The images obtained show no variation of contrast (which is proportional to the square of the atomic number, $Z^2$) in the height of the lines which proves the homogenous composition of the copper germanide phase formed in the trenches.

Figure 3:
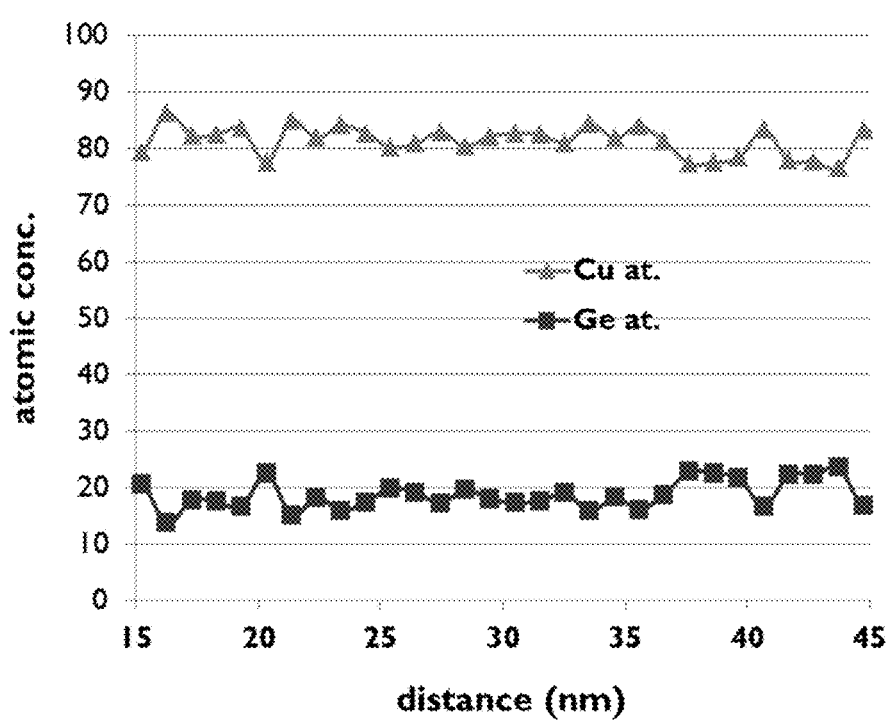
FIG. 3 represents the energy dispersive X-ray spectroscopy (EDS) quantification of Cu and Ge contents within the width of a 30 nm trench.

A first estimation of the Cu and Ge atomic concentrations has been performed using EDS (as shown in FIG. 3). Using this technique no variations of concentrations are observed within the width of the line and the composition of the $Cu_3Ge$ alloy formed is about 81.0 at. % Cu and about 19.0 at. % Ge (average on 30 points and standard deviation of 2.5%). This composition is somewhat lower than that expected for the ε1 phase according to the Cu—Ge phase diagram. However, this deviation could relate to the fact there were no calibration samples available to test the accuracy of the composition quantification by EDS.

Based on the TEM analyses it can be concluded that ε1-$Cu_3Ge$ is formed within the full height of the 30 nm half pitch trenches.

Further the electrical performance of the 30 nm half pitch structures filled with copper germanide of the disclosure was evaluated.

Figure 4A:
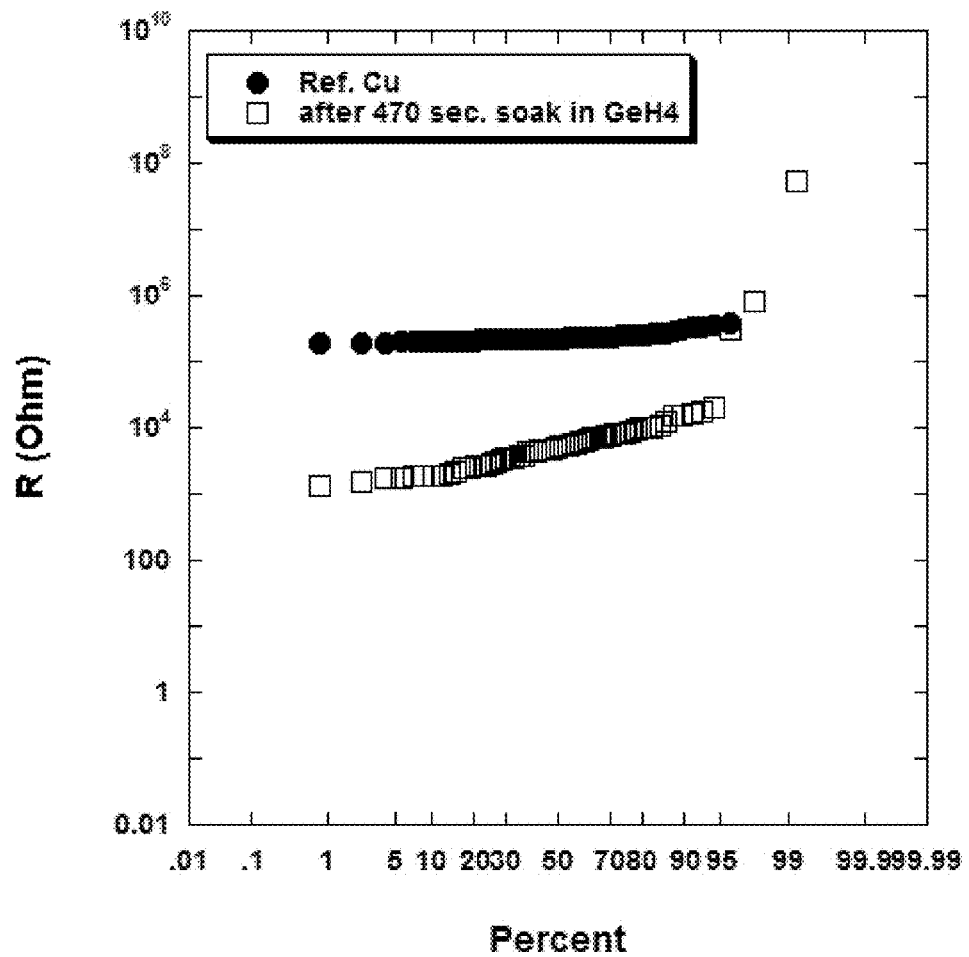
FIG. 4a represents the line resistance of 30/30 nm meander fork structures with and without Cu germanidation.
Figure 4B:
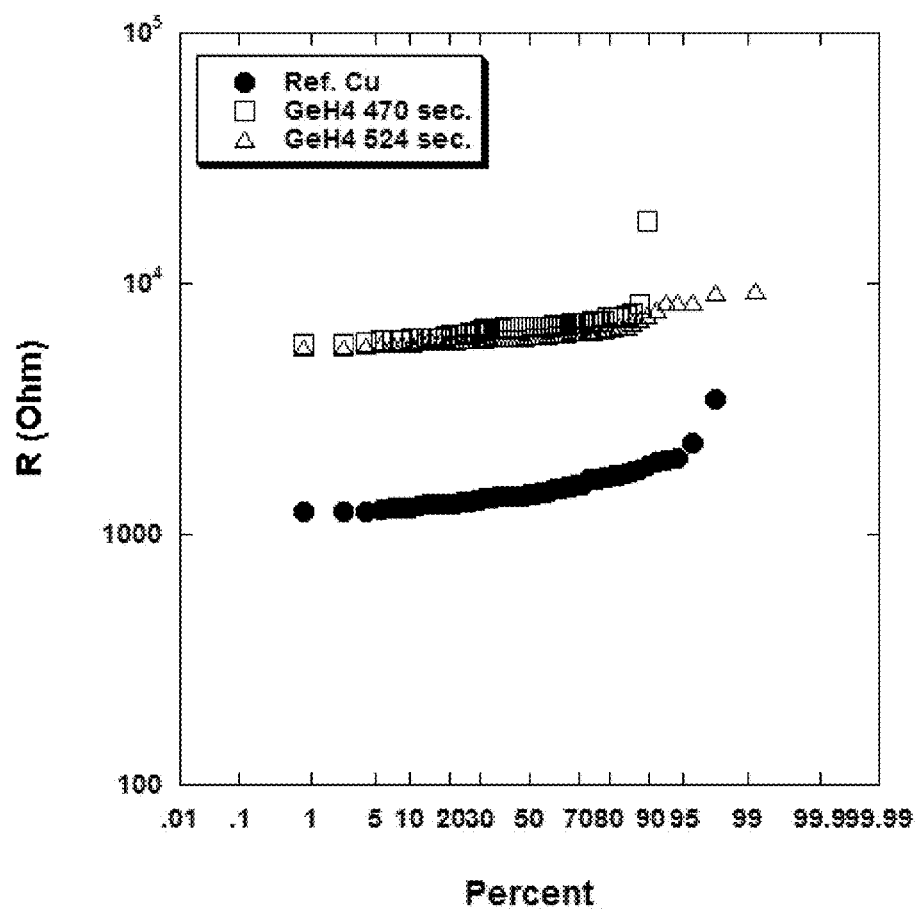
FIG. 4b represents the line resistance of 30/120 nm CD lines with and without Cu germanidation.

High electrical yields were obtained for the reference Cu on-pitch (30/30 nm meander-fork structures, FIG. 4a) and off-pitch (30/120 nm CD lines, FIG. 4b) electrical structures. In FIG. 4a the $Cu_3Ge$ grains bridge the neighboring trenches resulting in shorted meander-fork structures, therefore a lower R than that of the Cu is observed. In the case of off-pitch structures an increase in R observed for both soak times represented in FIG. 4b and this increase is due to the $Cu_3Ge$ formation. The increase in R amounts to about 4-5 times the R of pure Cu. After the additional $Cu_3Ge$ CMP step the R of $Cu_3Ge$ increases due to reduced height of the structures and it is finally about 5-6 times larger than that of pure Cu.

Figure 5A:
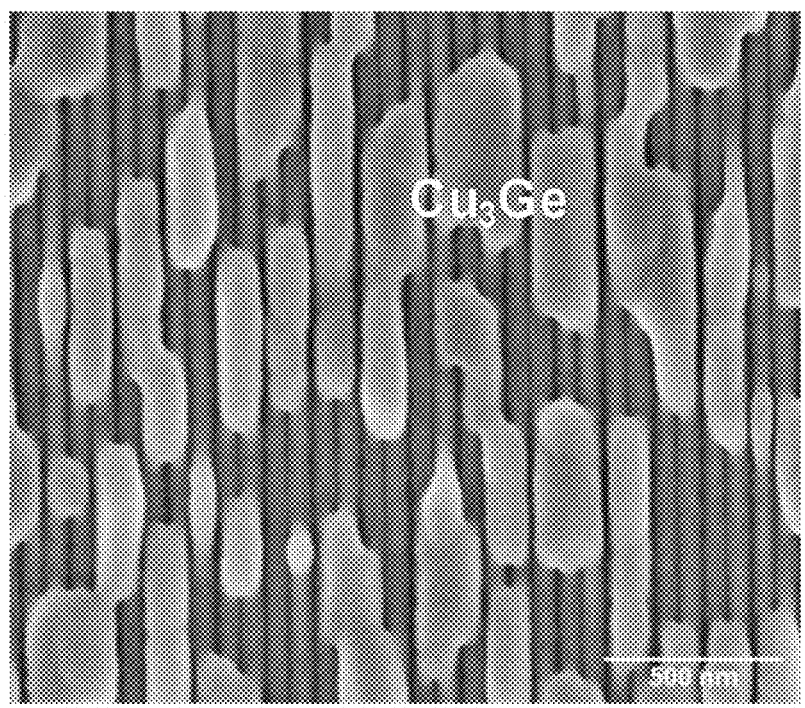
FIG. 5a represents Top-view SEM image of 30/30 nm meander fork structures. It is shown that $\varepsilon 1$-$Cu_3Ge$ grains are formed over neighboring trenches.
Figure 5B:
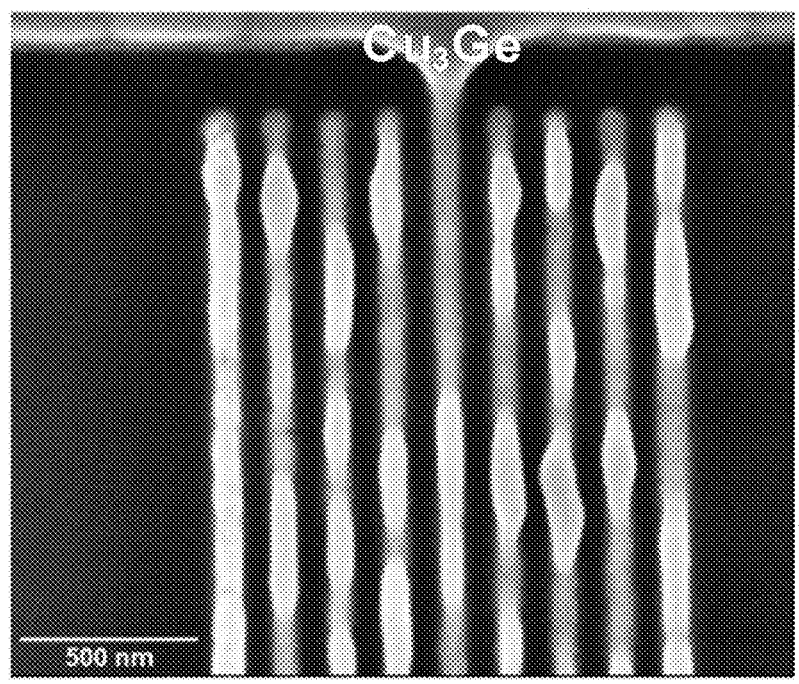
FIG. 5b represents Top-view SEM image of 30/120 nm CD lines. No bridging of neighboring trenches by the $\varepsilon 1$-$Cu_3Ge$ grains.

Top-view SEM inspections of the electrical structures show that the ε1-Cu$_3$Ge grain growth along the trenches is non-uniform, which could be a result of preferential Cu crystalline orientations more prone to germanidation than others as shown in FIG. 5a and FIG. 5b. This shows that the Cu—Ge reaction is favored by certain grain orientations. However, this is not really a drawback as further tests showed that the excess of Cu$_3$Ge can be removed by applying a subsequent CMP step to recover a good yield for the small pitch structures.

For on-pitch meander fork structures, with narrow spacings, the ε1-Cu$_3$Ge overgrown grains tend to spread over multiple trenches leading to electrical yield loss. This is not the case for off-pitch structures, with larger spacings. For these structures, no electrical yield loss is observed and the line resistance increase can only be attributed to the formation of ε1-Cu$_3$Ge.

Similar line resistance values are observed for both soak times of 470 seconds and 524 seconds which confirm that in both cases the Cu present in the trenches has been fully converted to ε1-Cu$_3$Ge. The median line resistance of the ε1-Cu$_3$Ge CD lines is about 4 times higher than that of copper, with larger heights of ε1-Cu$_3$Ge along the line.

After applying the additional Cu$_3$Ge CMP step, the resistivity measured for 30 nm ½ pitch structures is higher than that of Cu, but lower than that of W which is already an important improvement at these dimensions.

Different embodiments of the present disclosure show that ε1-Cu$_3$Ge has been formed in 30 nm half pitch trenches using a solid-vapor reaction after Cu metallization. The ε1-Cu$_3$Ge phase is formed within the full height of the trenches with a uniform Cu—Ge composition. Moreover the trenches filled with the method of the disclosure do not show any void formation, despite the volume increase accompanying the ε1-Cu$_3$Ge formation. For off-pitch structures, high electrical yields were obtained for ε1-Cu$_3$Ge lines with a median line resistance about 5-6 times higher than that of copper.

The method of the first embodiment allows a good phase control in both narrow and wide structures as compared to a solid state reaction approach.

Moreover the method of the first embodiment is applicable to Cu$_3$Ge formation in all types of structures (e.g. vias, dual damascene) by adjusting the soak time to the thickness of the Cu which needs to be converted to Cu$_3$Ge for a fixed soak temperature and partial pressure of the germanium precursor.

Advantageously, the method of the first embodiment is suitable for both on-pitch and large pitch structures. In general the on-pitch structures are structures for which the width and the spacing dimensions are available (i.e. 30/30 nm trenches), while the off-pitch structures are structures for which the width is different than the spacing (i.e. 30/140 nm trenches).

Preferably, an additional CMP can be introduced after the copper germanide formation to remove the Cu$_3$Ge overgrowth and improve the electrical results for the on-pitch 30/30 nm structures.

Alternatively Cu can be recessed inside the trenches prior to the germanidation step.

According to a second embodiment, the present disclosure relates to a method for forming a nickel germanide (NiGe) alloy in interconnect structures. In preferred embodiments the disclosure relates to a method for forming a Nickel germanide (NiGe) alloy in narrow interconnect structures characterized by a half pitch of 10 nm or smaller.

As previously described, with the down scaling of the interconnects technology, in the sub-20 nm line width region, the resistivity of interconnects is expected to dramatically increase. To a large extent this can be attributed to the increased grain boundary and surface scattering caused by the low electron mean free path of Cu (39 nm). Therefore, a suitable replacement for copper (Cu) offering a low resistivity in the region of interest needs to be found.

Nickel germanide (NiGe) has been found to be a suitable replacement for Copper (Cu) in reducing the interconnect resistivity. Although, nickel germanide (NiGe) may exhibit higher bulk resistivity compared to Copper (Cu), it has a slower resistivity increase as compared to copper (Cu) in dimensions below 30 nm, and more preferably in dimension below 20 nm.

However, the existing methods for obtaining the desired nickel germanide (NiGe) phase in the right stoichiometry are not suitable for use in narrow dimensions of below 20 nm.

According to the second embodiment of the present disclosure, a suitable method for obtaining the desired nickel germanide (NiGe) phase is presented. The method is based on a solid vapor reaction between nickel (Ni) and a germane precursor, such as GeH$_4$. This solid vapor reaction, also referred to herein below as germanidation, has been demonstrated to produce nickel germanide (NiGe) films of 10 nm thickness, which are closed, uniform and stoichiometric.

The method for forming an interconnect structure comprises:

Forming a recessed structure in a dielectric material on a substrate

Filling said recessed structure with nickel (Ni)

Introducing the nickel (Ni) filled recessed structure in a CVD reactor and bringing the substrate at a temperature of at least 250° C.

Performing a soak treatment with a germanium precursor at a soak temperature thereby forming a homogenous nickel germanide phase in the whole recessed structure.

Filling said recesses with nickel (Ni), also referred to as Ni metallization, can be performed by physical vapor deposition (PVD). Alternatively, the Ni metallization can be performed by ECP (standard Ni electroplating onto a PVD Ni seed), by CVD/ALD Ni and by ELD Ni (electroless Ni deposition).

The nickel germanide (NiGe) layers are produced without traditional barrier layers (TaN/Ta) compared to the Cu$_3$Ge and Cu structures. Therefore, the resistivity value reported is that of the intrinsic resistivity of nickel germanide (NiGe) with no contribution from underlying films.

Furthermore, nickel germanide (NiGe) is corrosion resistant, therefore, the step of plasma oxide clean to remove native oxide, as performed for Cu$_3$Ge, is not required for nickel germanide (NiGe). This can be beneficial in reducing the damage to the dielectric material caused by the plasma oxide clean, especially in the case where a low-k dielectric material is used. On the other hand, it was found that for NiGe films synthesized using Ni films≥10 nm, a pre-clean (e.g. a 6 s pre-clean using e.g. NH$_3$—N$_2$ plasma) helps in the early onset of germanidation.

It has been found that the germanidation reaction is selective to nickel (Ni) since no reaction has occurred with thermal silicon oxide (SiO$_2$) at any temperature up to 350° C.

The total pressure on the PECVD chamber where the nickel germanide (NiGe) formation takes place was at 4.2 Torr. The flow rate of GeH$_4$ can be adjusted to the desired partial pressure, i.e. between 70 and 420 mTorr.

The flow of the germane gas (GeH$_4$) can be varied in between 300 to 4000 sccm. Either the chamber total pressure or the N$_2$ flow can be adjusted such that the required partial pressure is reached. It has been found that the process window (GeH$_4$ partial pressure, soak temperature and time) was found to be quite broad indicting the reaction is self-limiting.

The process of the disclosure thus differs from conventional germanidation techniques wherein sequential Ge over Ni (or vice-versa) and Ni—Ge alloy deposition takes place first, followed by anneal to react the nickel with germanium and form nickel germanide.

A further advantage of using nickel germanide (NiGe) as a replacement to copper (Cu), is that the process parameters of nickel germanide (NiGe) are not sensitive to the thickness of the initial Ni films. The broad window indicates that partial pressure of Ge precursor (GeH$_4$), the soak temperature (also referred to as germanidation temperature) and soak time are not strongly related to the nickel (Ni) thickness.

Alternatively the Ge precursor can be any of GeCl$_4$, digermane (Ge$_2$H$_6$), trigermane (Ge$_3$H$_8$), phenyl germane, GeCl$_3$, tetramethyl germane, tetraethyl germane, tetra n-butyl germane, germanium (IV) ethoxide, iso-butyl germane, trimethyl germanium chloride, iso-butyl germanium tri chlorides or combinations thereof.

In a particular example, a nickel (Ni) film having a thickness of 4 nm is used to form low resistive nickel germanide (NiGe). The nickel (Ni) film was placed in a PECVD chamber having a fixed GeH$_4$ partial pressure of 225 mTorr and temperature of 250° C., whereby low resistive nickel germanide (NiGe) films are formed in the soak time interval of 30-180 sec.

The constant sheet resistance values observed over a broader process window indicate a rather stable process compared to Cu$_3$Ge where increase of soak time had a detrimental effect resulting in the incorporation of Ge enhancing the R$_S$ values.

The identification of the nickel germanide (NiGe) phase was performed by indexing the selected area electron diffraction patterns, GIXRD spectra and Rutherford backscattering (RBS) analysis. All selected area electron diffraction/GIXRD patterns could be indexed using the lattice parameters of the orthorhombic crystalline structure of nickel germanide (NiGe).

Figure 6A:
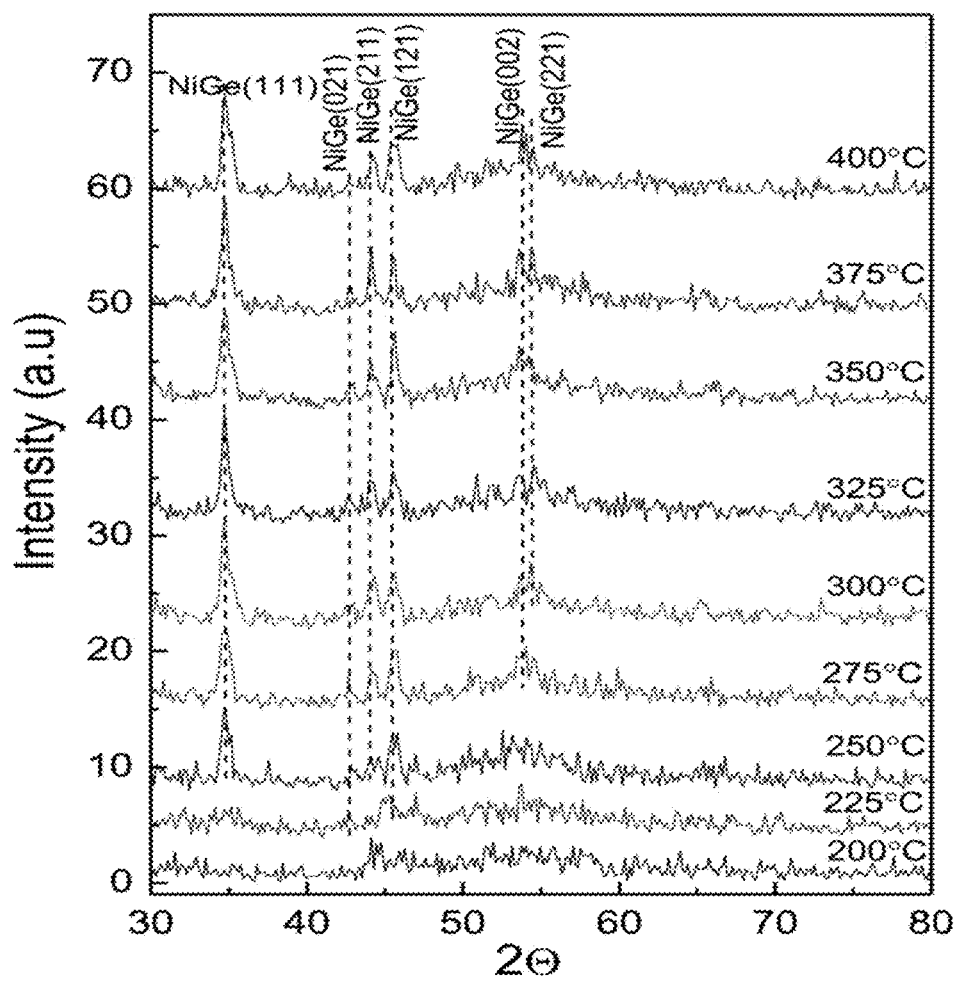
FIG. 6a presents the GIXRD spectra obtained for different soak temperatures on 10 nm Ni at constant $GeH_4$ partial pressure (225 mT) and soak time (1 min). The data are offset for clarity.
Figure 6B:
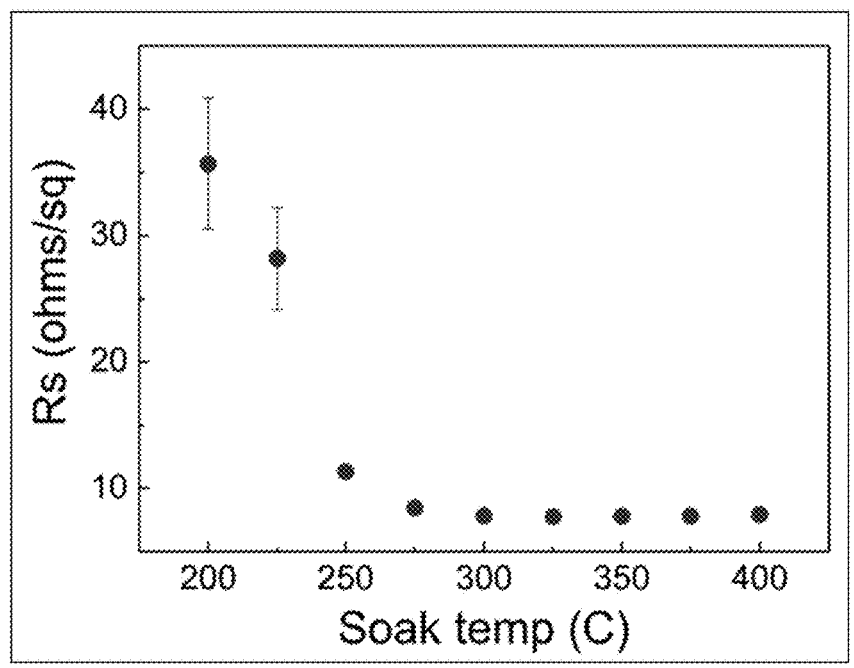
FIG. 6b shows the Impact of soak temperature on the sheet resistance of the films.

FIGS. 6a and 6b demonstrate the impact of soak time on the GIXRD phase formation and the R$_S$ values of the prepared layers. The germanidation reactions were carried out at the partial pressure and temperature of 225 mTorr GeH$_4$ and 300° C. respectively. A 15 sec soak time lead to triphasic mixture consisting of Ni$_2$Ge+NiGe+Ni$_5$Ge$_2$. Increasing the soak time to 30-240 sec leads to signatures corresponding to that of nickel germanide (NiGe) phase. At 300 sec, though the nickel germanide (NiGe) peaks predominates, a very weak peak due to Ge(111) reflection is noticed. A close look at the Rs trend shows an unaltered value (~7.9 ohms/sq) in the soak time regime (45-120 sec) which then slightly increases to 8.0-8.3 ohms/sq for the rest of the soak time studied. To further confirm the broad nickel germanide (NiGe) phase formation and Rs window, RBS stoichiometric analysis were extended to the films grown under different soak times (15-300 sec). RBS results confirm that the atomic ratio of Ni to Ge is 1:1 corresponding to mono nickel germanide (NiGe) in the range 30-120 sec. Films grown at 15 sec under soak conditions was found to be rich in Ni content as the stoichiometric ratio was found to be 1.37. Higher soak times in the region (180-300 sec) that resulted in insignificant increase in sheet resistance values, was found to be rich in Ge content, as the Ni to Ge stoichiometry was found to be 0.90.

Figure 7:
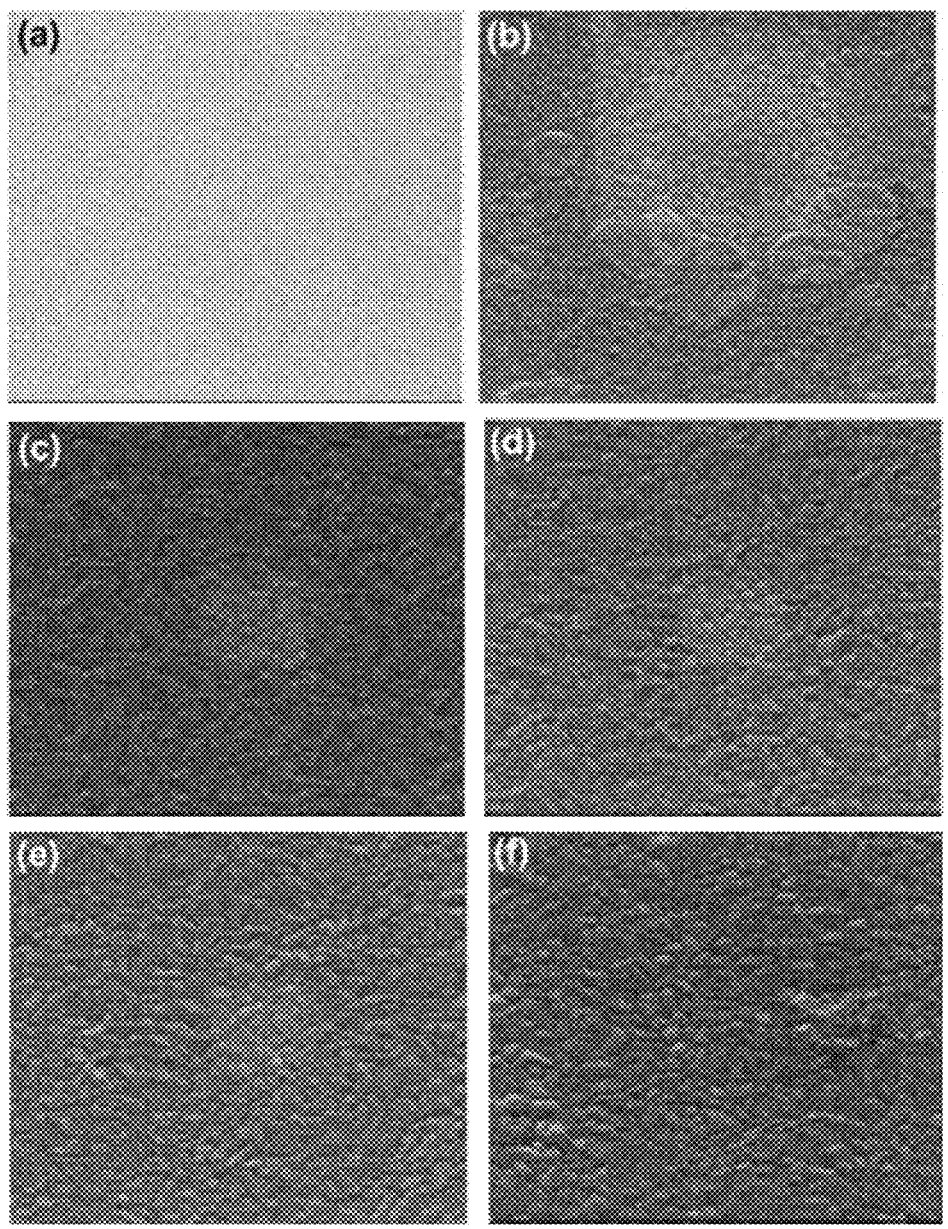
FIG. 7a-7f shows the representative SEM morphology of Ni and NiGe films observed at different soak time (a) 0 sec: Reference 10 nm Ni, (b) 15 sec, (c) 30 sec, (d) 45 sec (e) 60 sec and (f) 300 sec soak.

FIG. 7a-7f shows the top-view SEM morphology of the nickel germanide (NiGe) films that were synthesized at different soak time along with reference Ni films. The as deposited Ni films were found to be consisting of flat and featureless morphology, as shown in FIG. 7a. A clear distinction in surface morphology could be noticed after the germanidation reaction with GeH$_4$. Barring the 15 sec soak, shown in FIG. 7b, the film morphology was found to be the same, exhibiting compact-like grainy structures for all the soak times studied. Even for the higher soak time (300 sec) where the composition deviates from ideal nickel germanide (NiGe) to Ge rich films, the excess Ge grains were not detected. Patches of clusters, driven by nucleation and aggregation, FIG. 7b, noted for 15 sec soak time shows the onset of germanidation reaction with Ni.

Further chemical analysis of the nickel germanides were performed by Energy dispersive spectroscopy (EDS) and high angle annular dark field-scanning transmission electron microscopy (HAADF-STEM) analysis. The images obtained show no variation of contrast (which is proportional to the square of the atomic number, Z$^2$) proving the homogenous composition of the nickel germanide phase formed in the films.

Figure 8:
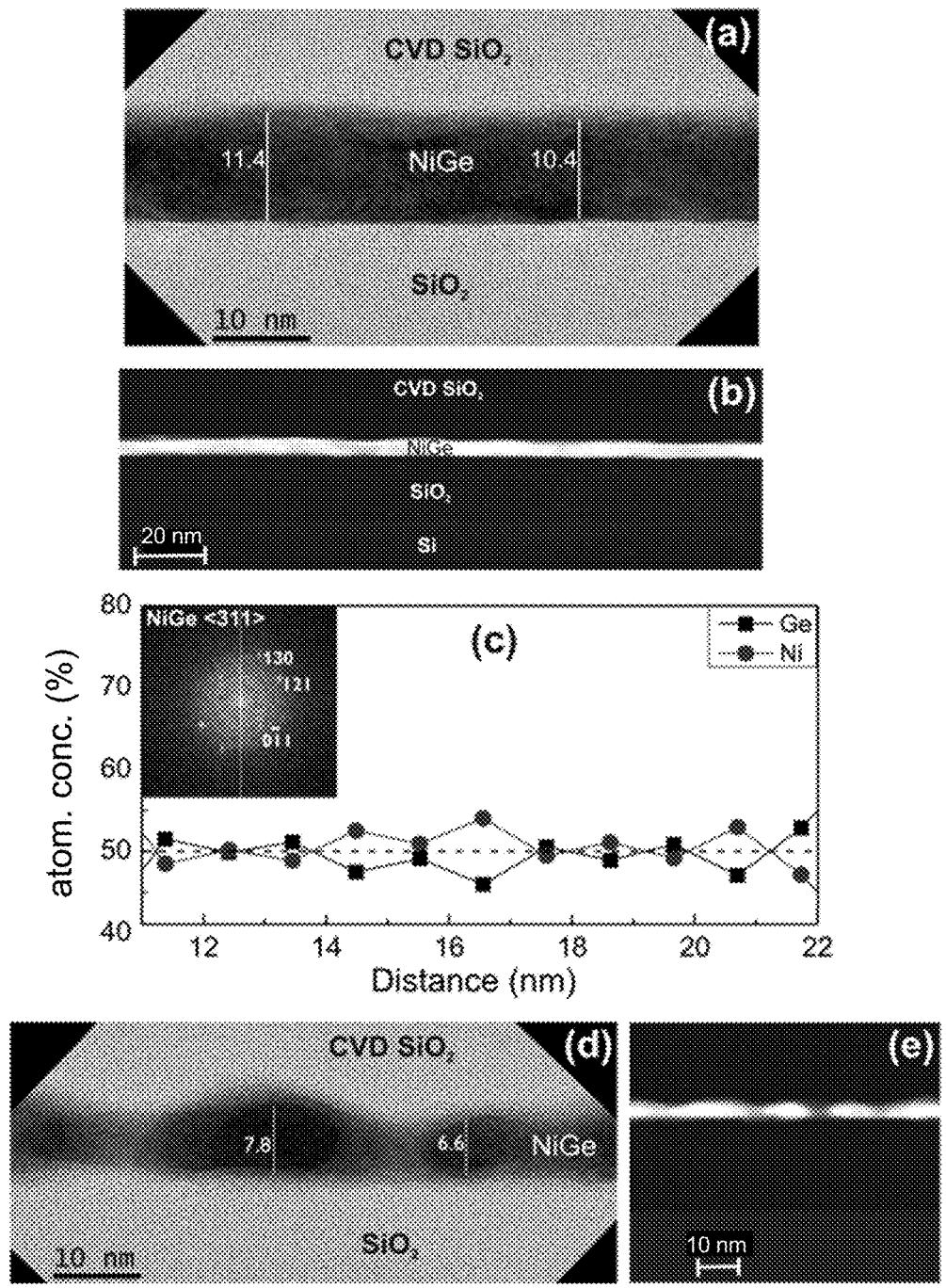
FIG. 8a-8b shows the TEM cross sectional and dark field STEM image of NiGe films synthesized from 4 nm Ni.
FIG. 8c presents the EDS elemental composition in the thickness of the NiGe layers. The inset shows the electron diffraction pattern derived from the NiGe layers.
FIG. 8d-8e show the TEM cross sectional and HAADF-STEM image of NiGe films synthesized from 2 nm Ni.

The nickel germanide (NiGe) films grown using 4 and 2 nm Ni were subjected to TEM analysis and the results of which are presented in FIG. 8. FIG. 8a shows the cross-sectional TEM image of nickel germanide (NiGe) films exhibiting sharp and planar interface with the underlying thermal oxide surfaces. No new interface phase formation, morphological instability or voids noted shows the films to have good adhesion with the surface. The thickness of nickel germanide (NiGe) film grown over 4 nm Ni was found to 10.5 nm. FIG. 8b depicts the HAADF-STEM image of nickel germanide (NiGe) layers showing a homogeneous contrast throughout the thickness indicating no variation in film composition. This was also complemented by the dark field STEM analysis that showed a uniform contrast in film density and crystallinity (results not shown). The EDS line profile compositional analysis carried out through the thickness of nickel germanide (NiGe) films is given in the FIG. 8c. Using this technique no variations of concentrations are observed within the films and the composition of the nickel germanide (NiGe) alloy formed is about 49.6 at. % Ni and about 50.4 at. % Ge (average on 11 points and standard deviation of 2.1%). This composition is perfectly in line with the stoichiometric analysis performed by RBS analysis. Fast Fourier Transformation (FFT) patterns obtained from the high resolution images showed the films to be polycrystalline. The electron diffraction pattern could be indexed to orthorhombic nickel germanide (NiGe) lattices, (space group: pbnm, a=0.5381, b=0.5811 and c=0.3428, α=β=γ=90°) similar to that of GIXRD findings. A typical diffraction pattern obtained from the 10 nm nickel germanide (NiGe) films is given in the inset of FIG. 8c. FIG. 8d presents the cross-section TEM image of nickel germanide (NiGe) films grown over 2 nm Ni films. From the contrast one could clearly see vacant-like region between the dark grains suggesting the layer is not closed. FIG. 8e presents the HAADF-STEM image of NiGe films synthesized from 2 nm Ni films.

Based on all analyses, it can be concluded that low resistive stoichiometric nickel germanide (NiGe) is formed according to the method of the present disclosure. A resistivity value of 29 µΩ·cm is estimated for a 10 nm nickel germanide (NiGe) films (from 4 nm Ni).

According to a third embodiment, the present disclosure relates to a method for forming a cobalt germanide alloy ($CoGe_2$) in interconnect structures. More specifically the present disclosure relates to a method for forming a cobalt germanide alloy ($CoGe_2$) alloy in narrow interconnect structures characterized by a half pitch of 30 nm or smaller, preferably characterized by a half pitch of 10 nm or smaller.

Cobalt germanide alloy ($CoGe_2$) has been found to be a suitable replacement to copper (Cu) in reducing the interconnect resistivity. Although the bulk resistivity of cobalt germanide alloy ($CoGe_2$) alloy is higher compared to copper (Cu), the resistivity increase of cobalt germanide alloy ($CoGe_2$) is slower for interconnect dimensions of 30 nm or smaller.

The present disclosure provides a method for obtaining a low resistivity cobalt germanide alloy ($CoGe_2$) alloy in contacts and interconnects by using a solid vapor reaction between cobalt (Co) and germane precursor, such as $GeH_4$, referred to herein as germanidation. The method has been demonstrated to produce cobalt germanide alloy ($CoGe_2$) films of 10 nm thickness, which are closed, uniform and stoichiometric.

The method for forming an interconnect structure using a germanide alloy ($CoGe_2$) alloy comprises:
  Forming a recessed structure in a dielectric material on a substrate,
  Filling said recessed structure with cobalt (Co),
  Introducing the cobalt (Co) filled recessed structure in a CVD reactor and bringing the substrate at a temperature of at least 250° C.,
  Performing a plasma assisted pre-clean in a reducing atmosphere in-situ and thereafter,
  Performing a soak treatment with a germanium precursor at a soak temperature thereby forming a homogenous cobalt germanide phase in the whole recessed structure.

Filling the recessed structure with cobalt (Co) can be performed by physical vapor deposition (PVD), chemical vapor deposition (CVD), or any other suitable method.

The plasma assisted clean, also referred to herein as plasma pretreatment, was performed in a reducing environment. Preferably the plasma clean may be selected to be compatible with low-k materials to avoid excessive damage.

The in-situ plasma assisted clean applied before the exposure to germanium precursor removes the native cobalt (Co) oxide present on the cobalt (Co) film thereby facilitating the germanidation of cobalt.

According to the third embodiment, the cobalt (Co) metal is grown on Titanium Nitride (TiN) layer, of approximately 2 nm, deposited in the recessed structure of the dielectric material, e.g., $SiO_2$.

It has been found that the germanidation reaction is selective to cobalt (Co) since no reaction has occurred with thermal $SiO_2$ at any temperature up to 350° C.

The total pressure on the PECVD chamber where the cobalt germanide ($CoGe_2$) formation takes place was at 4.2 Torr. The flow rate of $GeH_4$ can be adjusted to the desired partial pressure.

The flow of the germane gas, such as $GeH_4$, can be varied by either adjusting the chamber total pressure or the $N_2$ flow such that the required partial pressure is reached. From tests performed the process window ($GeH_4$ partial pressure, soak temperature and time) was found to be quite broad indicting the reaction is self-limiting.

Figure 9:
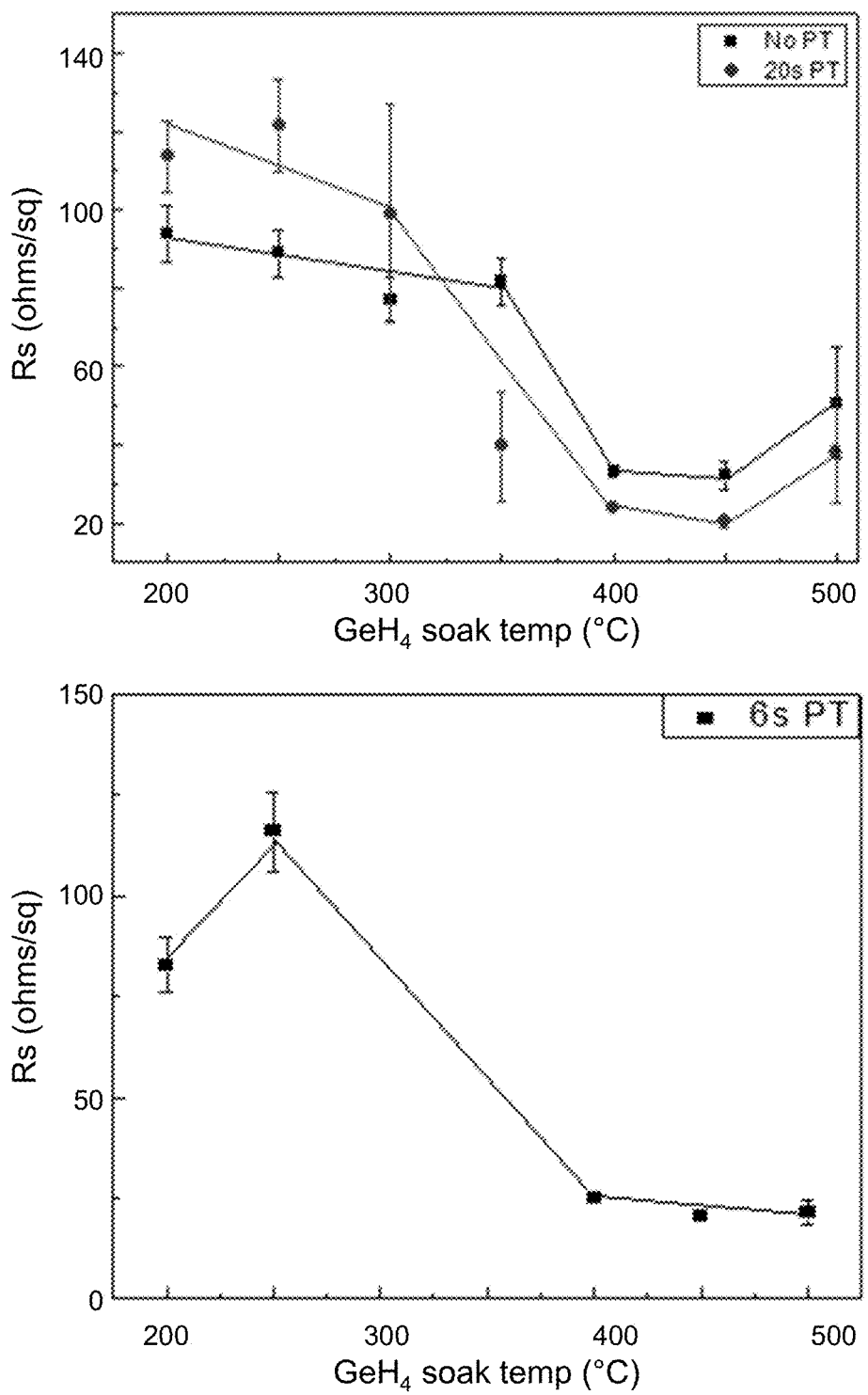
FIG. 9 shows the sheet resistance and GIXRD analysis obtained from different soak temperatures on a 10 nm cobalt (Co) film with and without plasma pretreatment.

In particular examples a cobalt (Co) film with thickness of 10 nm is placed in a CVD reactor at a fixed $GeH_4$ partial pressure of 225 mTorr and temperature at 400° C. As shown in FIG. 9, low resistive cobalt germanide ($CoGe_2$) films are formed in the soak time interval of 1 minute with a plasma pretreatment of 0-20 sec. For the case of Co, the germanidation is possible even without the plasma pretreatments. But a 6 or 20 sec plasma pretreatment may help not only in the early onset of the germanidation reaction, but also facilitate the $CoGe_2$ film closure using 5 nm Co films (possibly enhancing the film nucleation and growth).

Figure 10:
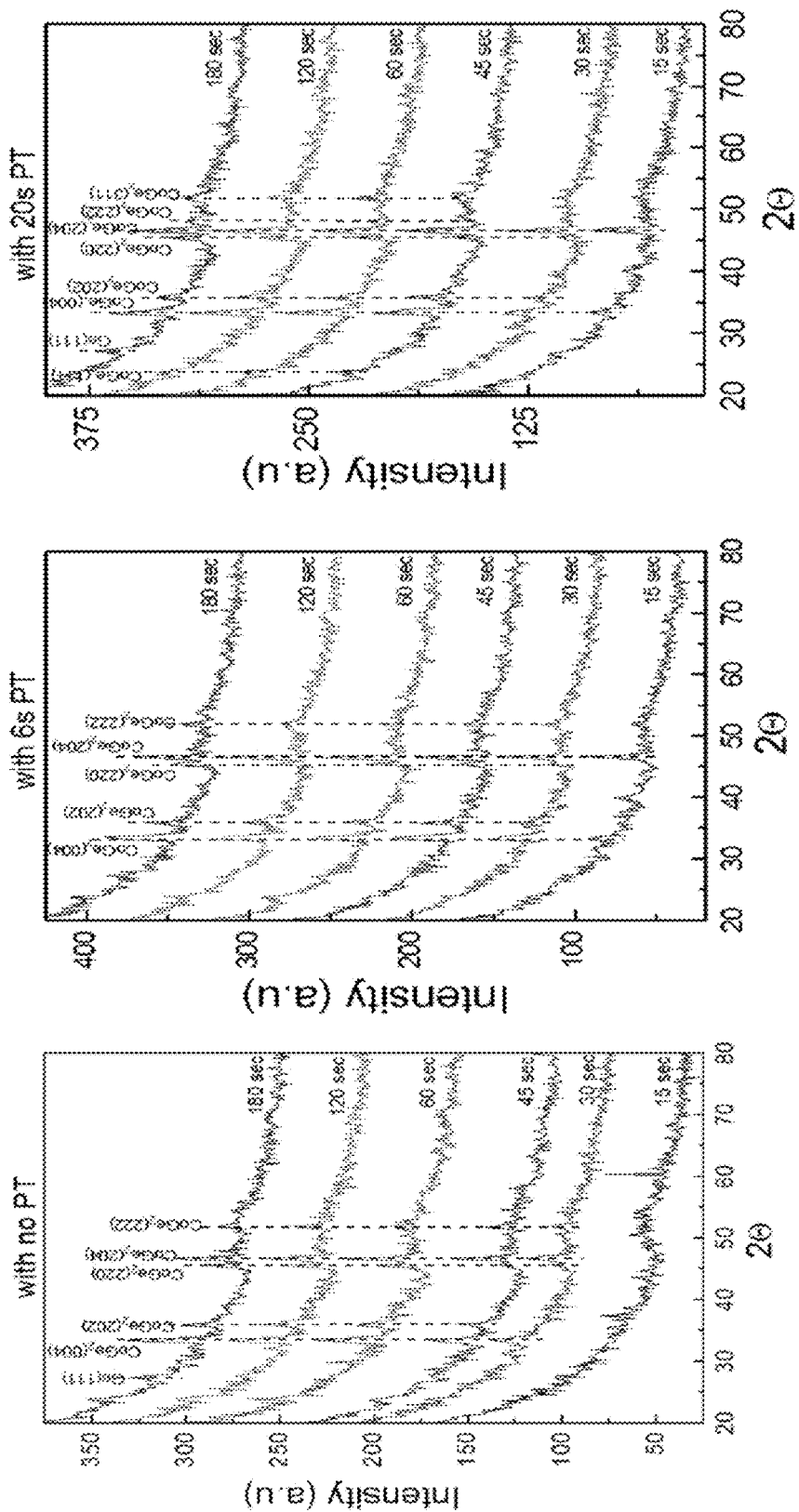
FIG. 10 presents the GIXRD spectra obtained for different soak time and plasma treatment duration on a 10 nm cobalt (Co) film.

The dependence of cobalt germanide ($CoGe_2$) formation on the soak time and plasma treatment duration was also investigated. FIG. 10 shows that early $CoGe_2$ formation (15 sec) is observed with plasma pretreatment prior to $GeH_4$ exposure, while excessive soak (180 sec) leads to minor Ge incorporation for Cobalt films that undergone no plasma treatment (PT) or a 20 s plasma treatment (PT).

Based on all analyses, it can be concluded that low resistive stoichiometric $CoGe_2$ is formed, having a resistive value of 70 µΩ·cm for 10 nm Plasma treated $CoGe_2$ films.

A comparative analysis of cobalt germanide ($CoGe_2$) and nickel germanide (NiGe) is shown in the table below. This is a summary of Ni and Co germanides on blanket wafers.

|  | NiGe | $CoGe_2$ |
| --- | --- | --- |
| Start metal deposition technique | PVD Ni | CVD Co |
| Start metal resistivity thickness (nm) | 21 µΩ · cm (11 nm) 29 µΩ · cm (7 nm) 76 µΩ · cm (5 nm) | 65 µΩ · cm (7 nm) 135 µΩ · cm (4 nm) |
| Barriers/liner | No | 2 nm TiN |
| $NH_3/NH_2$ Plasma Pretreatment | NO | Yes (6-20 s) |
| Morphology | Closed Smooth | Closed Smooth |
| rms (nm) | 0.73 nm | 2.14 nm |
| thickness (nm) | (10 nm) | (20 nm) |
| Thermal stability | 500° C. | tbd |
| Resistivity | 29 µΩ · cm | 70 µΩ · cm |
| Thickness (nm) | 10 nm | 20 nm |

Figure 12:
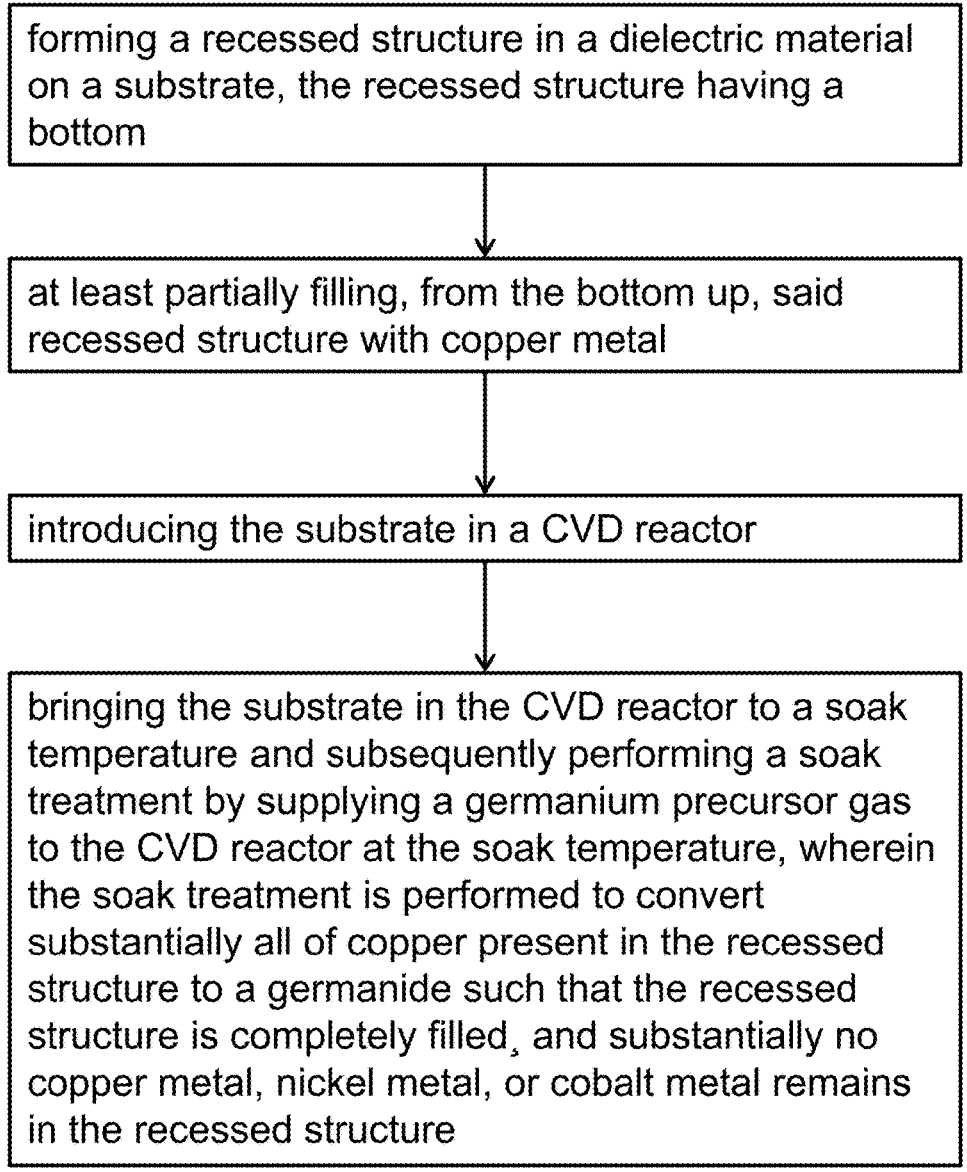
FIG. 12 is a process flow chart for a method of making a nickel germanide interconnect structure according to another embodiment of the disclosure.
Figure 13:
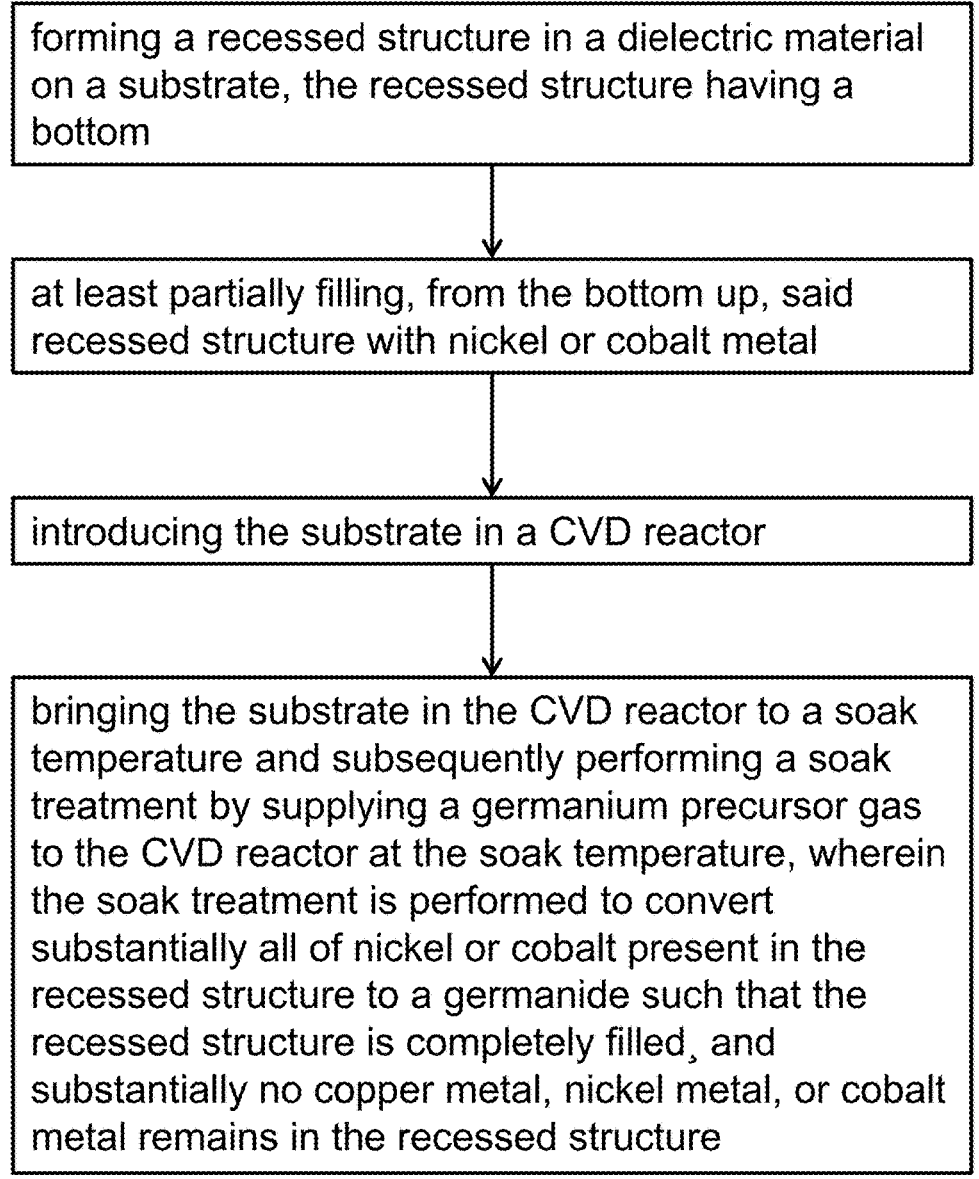
FIG. 13 is a process flow chart for a method of making a cobalt germanide interconnect structure according to another embodiment of the disclosure.

FIGS. 11, 12 and 13 are process flow diagrams for various methods of making interconnect structures as described herein. FIG. 11 relates to a general method, in which the metal is copper, nickel or cobalt, or a combination thereof. FIG. 12 relates to the use of copper as the metal. And FIG. 13 relates to the use of nickel or cobalt as the metal.

Figure 14:
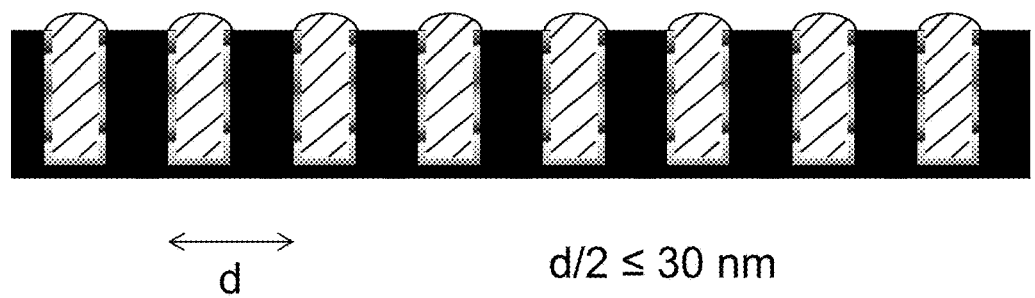
FIG. 14 is a schematic view of a device in which the recessed structure is part of a repetitive pattern having a half pitch (d/2) equal to or smaller than 30 nm.
Figure 15:
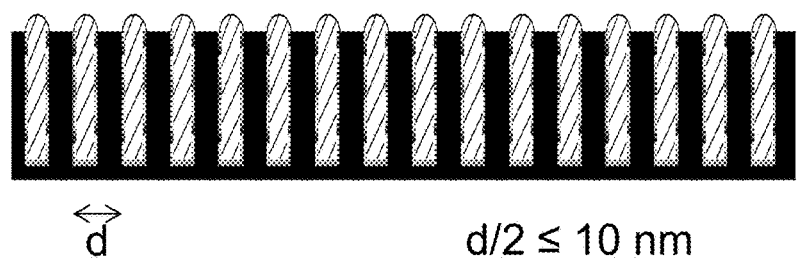
FIG. 15 is a schematic view of an device in which the recessed structure is part of a repetitive pattern having a half pitch (d/2) equal to or smaller than 10 nm.

As noted above, the methods described herein can be used to make structures having a half pitch less than or equal to 30 nm or less than or equal to 10 nm. FIGS. 14 and 15 provide schematic views of devices in which the recessed structure is part of a repetitive pattern having a half pitch (d/2) less than or equal to 30 nm and 10 nm, respectively.

According to any of the embodiments of the present disclosure the dielectric material is an inter-metal dielectric (IMD). Non limitative examples of IMD are: low-k materials, oxides, dielectric including pores and/or airgaps. The low-k materials are dielectrics characterized by a dielectric constant lower than that of silicon oxide which are widely used in interconnect applications.

Furthermore, the formation of a metal germanide alloy inside the recessed structure is accompanied by a volume increase that is characterized by metal germanide overgrowth on top of the trenches, which needs to be removed.

According to embodiments of the present invention, a Chemical Mechanical Polishing (CMP) step may successfully be employed to remove the overgrowth on top of the trenches caused by the volume increase of the resulting metal germanide alloy.

Alternatively, the recessed structure may be partially filled with the metal fins, such as copper (Cu), nickel (Ni) and cobalt (Co), thereby accounting for any volume expansion occurring after the conversion of the metal to the $Cu_3Ge$ alloy. In this way a substantially flush top surface can be achieved without the need for employing CMP to remove any overgrowth, thereby reducing or preventing the damage to the dielectric. This is especially advantageous in the case where the dielectric comprises Low-k material According to embodiments of the present disclosure the method can be used for the formation of on-pitch and large pitch interconnect structures. Non limiting examples of such structures include but not limited to contacts, trenches and bondpads.

Furthermore, the interconnect structures may form arrays of interconnect structures, such as meander forks. These structures can be integrated in a semiconductor device and be adapted to cooperate with other passive or active structures found therein, such as capacitors, diodes, restrictors and transistors.

The invention claimed is:

1. A method for forming an interconnect structure, comprising the steps of:
   a) forming a recessed structure in a dielectric material on a substrate, the recessed structure having a bottom;
   b) at least partially filling, from the bottom up, said recessed structure with a metal, the metal being chosen from the group consisting of copper, nickel and cobalt, or combinations thereof;
   c) introducing the substrate in a CVD reactor;
   d) bringing the substrate in the CVD reactor to a soak temperature and subsequently performing a soak treatment by supplying a germanium precursor gas to the CVD reactor at the soak temperature, wherein the soak treatment is performed to convert substantially all of any copper metal, nickel metal and cobalt metal present in the recessed structure to a germanide such that the recessed structure is completely filled, and substantially no copper metal, nickel metal, or cobalt metal remains in the recessed structure.

2. The method of claim 1, wherein the metal is copper, wherein the method comprises the following steps in between said steps c and d:
   e) bringing the substrate to a pre-clean temperature which is preferably equal to the soak temperature;
   f) performing a plasma assisted pre-clean in a reducing atmosphere in-situ;
and wherein the germanide that is formed in said step d is copper germanide having a $\epsilon 1$-$Cu_3Ge$ phase.

3. The method of claim 2, wherein the reducing atmosphere comprises $NH_3$ or $H_2$.

4. The method of claim 2, wherein the plasma assisted pre-clean is performed at a temperature of 250° C.

5. The method of claim 2, wherein the dielectric material is silicon oxide and wherein the copper is deposited in the recessed structure over a TaN/Ta stack which is applied in a preceding step.

6. The method of claim 1, wherein the metal is nickel which is directly deposited on the dielectric material in the recessed structure.

7. The method of claim 1, further comprising, before at least partially filling the recessed structure with the metal in step (b), applying a layer of titanium nitride in the recess, the metal in step (b) being cobalt and being deposited in the recessed structure on the layer of titanium nitride.

8. The method of claim 6, wherein the method comprises the following steps in between said steps c and d:
   g) bringing the substrate to a pre-clean temperature which is preferably equal to the soak temperature;
   h) performing a plasma assisted pre-clean in a reducing atmosphere in-situ.

9. The method of claim 1, wherein the germanium precursor is germane, $GeH_4$.

10. The method of claim 1, wherein the germanium precursor is supplied in presence of a carrier gas and wherein preferably the carrier gas is $N_2$.

11. The method of claim 1, wherein the partial pressure of the germanium precursor in the reactor is between 70 to 420 mTorr.

12. The method of claim 1, wherein the soak temperature is in the range from 250° C. to 400° C.

13. The method of claim 1, wherein said recessed structure is part of a repetitive pattern having a half pitch equal to or smaller than 30 nm.

14. The method of claim 6, wherein said recessed structure is part of a repetitive pattern having a half pitch equal to or smaller than 10 nm.

15. The method of claim 1, wherein said recessed structure is a via or a trench.

16. The method of claim 1, wherein the dielectric material has a top surface adjacent the recessed structure, and wherein the recessed structure is only partially filled in said step b and wherein said conversion in said step d results in the germanide having a top surface that is substantially flush with the top surface of the dielectric material adjacent the recessed structure.

17. The method of claim 1, further comprising an additional chemical mechanical polishing step to remove overgrown parts of the germanide that are overgrown from the recessed structure.

18. A method according to claim 1, wherein the chosen metal is copper and the soak treatment is performed to convert substantially all copper metal in the recessed structure to copper germanide.

19. A method according to claim 1, wherein the chosen metal is cobalt and the soak treatment is performed to convert substantially all cobalt metal in the recessed structure to cobalt germanide.

20. A method according to claim 1, wherein the chosen metal is nickel and the soak treatment is performed to convert substantially all nickel metal in the recessed structure to nickel germanide.

21. A method according to claim 1, wherein in step b) the recessed structure is completely filled with the metal chosen from the group consisting of copper, nickel and cobalt, or combinations thereof.

22. A method according to claim 1, further comprising, before at least partially filling the recessed structure with the metal in step (b), applying a barrier layer in the recess, the metal in step (b) being deposited in the recessed structure on the barrier layer.

* * * * *